United States Patent [19]

Tomlinson

[11] 4,168,529

[45] Sep. 18, 1979

[54] CODE SYNCHRONIZING APPARATUS

[75] Inventor: Martin Tomlinson, Christchurch, England

[73] Assignee: The Secretary of State for Defence in Her Britannic Majesty's Government of the United Kingdom of Great Britain and Northern Ireland, London, England

[21] Appl. No.: 891,251

[22] Filed: Mar. 29, 1978

[30] Foreign Application Priority Data

Mar. 29, 1977 [GB] United Kingdom ............... 13246/77

[51] Int. Cl.² ............................................. G06F 15/34
[52] U.S. Cl. .................................................. 364/728
[58] Field of Search ........................................ 364/728

[56] References Cited

U.S. PATENT DOCUMENTS

| | | | |
|---|---|---|---|
| 3,412,334 | 11/1968 | Whitaker | 364/728 |
| 3,701,894 | 10/1972 | Low et al. | 364/728 |
| 3,883,729 | 5/1975 | De Cremiers | 364/728 |
| 4,007,330 | 2/1977 | Winters | 364/728 X |

*Primary Examiner*—Jerry Smith
*Attorney, Agent, or Firm*—Pollock, Vande Sande and Priddy

[57] ABSTRACT

A code synchronizing apparatus for synchronizing a local pseudo-random binary-sequence code generator with signals of a pseudo-random binary-sequence carried on incoming signals from a remote source, includes a sampler for obtaining sequences of samples of an input signal and of local code signals from a signal generator, a correlator for correlating the sequences of samples with those of local code signals which are offset by different integral numbers of bit-periods from a sequence of local code signals produced while the input signals were being sampled, an adder for summing the correlation values for each offset, means for identifying the offset which produces the maximum summation of correlations, and a correlation counter for correcting the timing of the local code generator by an amount dependent on the magnitude of the offset so identified.

3 Claims, 5 Drawing Figures

CODE SYNCHRONIZING APPARATUS

BACKGROUND AND SUMMARY OF THE INVENTION

The present invention relates to code synchronizing apparatus for synchronizing a local pseudo-random binary-sequence code generator with signals of a pseudo-random binary-sequence carried on incoming signals from a remote source.

In various equipments, and particularly in the technique of spread-spectrum communications, it is required to detect a given pseudo-random binary-sequence carried on incoming signals and to synchronize a local code sequence generator so that the local generator will provide an identical code sequence. Reasons for doing this, and known arrangements for the purpose, are well reviewed in papers by R. L. Harris, N. G. Davies and C. R. Cahn, published in "Spread Spectrum Communications" (AGARD Lecture Series No. 58) published by the North Atlantic Treaty Organization, July 1973, particularly in pages 3-1 to 3-21 of the lecture by R. L. Harris and in pages 4-17 to 4-24 of the lecture by N. G. Davies. In many cases the incoming signals will have a very poor signal-to-noise ratio and correlation over a large number of code bit periods will be required. The bit-rate of the incoming signals may be subject to an unknown frequency error or doppler shift, which may well be sufficient to defeat attempts to improve the signal-to-noise ratio to the extent required by straightforward arrangements for correlating the signals over a sufficiently long time interval.

According to the present invention there is provided code synchronizing apparatus including means for obtaining a sequence of samples of an incoming signal and a sequence of local code signals from a local code generator, means for correlating the sequence of samples with sequences of local code signals offset by different integral numbers of bit-periods from a sequence of local code signals produced while the incoming signals were being sampled, means for repeating these actions successively and adding together the correlation values obtained for each offset from a plurality of sampling and correlating actions, means for identifying the offset which produces the maximum correlation total, and means for correcting the timing of the local code generator by an amount dependent on the magnitude of the offset so identified.

The length of each sequence correlated should be limited to ensure that anticipated frequency errors or doppler shifts will not have a serious effect, but the results of a comparatively large number of correlations are summed together to get a desired improvement in signal-to-noise ratio.

According to a preferred form of the invention, the correlation means comprises means for correlating each of a plurality of consecutive subsequences of n signal samples with all possible subsequences of n binary digits and storing the results of these correlations, means for deriving the correlation between a local code sequence and a signal sample sequence by reference to and summing together stored correlation results relating to subsequences of binary digits occurring in the local code sequence, and means for repeating the reference and summation steps for each offset sequence.

Theoretically the optimum subsequence length n is the nearest integral value to a solution of the equation $$L = 2^n[1 + 0.7n(n-1)] \quad (1)$$

where L is the length of a complete cycle of the pseudo-random binary sequence to be used. This preferred technique reduces the number of additions required by a factor approximately equal to n. The optimum value of n minimizes the number of additions needed, but any convenient value within a range of about ±30% from the optimum may be used without greatly increasing the number of additions required.

The number of additions required to correlate n sample values with n binary digits is $n-1$. When each sequence of length S is treated as a series of $N = S/n$ subsequences, and each subsequence is correlated with each of the $2^n$ possible permutations of n binary digits, the total number of additions required is $n \cdot 2^n (n-1)$. Each reference and summation process requires $N-1$ additions to form the correlation between one sample sequence and one local code sequence. For each sample sequence this is done for each of L local code sequences with different offsets from a local code sequence produced simultaneously with the sampling of the incoming signals, requiring $L(N-1)$ additions altogether. Thus the total number of additions required to derive the correlations needed for each sample sequence is $$L(N-1) + N \cdot 2^n(n-1) \quad (2)$$

To correlate a sample sequence of length S directly with L offsets of a local code sequence of length S would require $L(S-1)$ additions. Equation (1) is derived by putting $N = S/n$ in the expression (2), differentiating with respect to n, setting the derivative equal to zero and using the approximation $\log_e 2 = 0.7$.

DESCRIPTION OF THE PREFERRED EMBODIMENT

An embodiment of the invention will now be more fully described, by way of example only, with reference to FIGS. 1 to 5 inclusive which are schematic circuit diagrams showing the parts and interconnections of a code synchronizing apparatus involved in successive stages of a synchronizing process. Parts which are shown in more than one of the Figures are given the same reference numbers wherever they appear.

Figure 1:
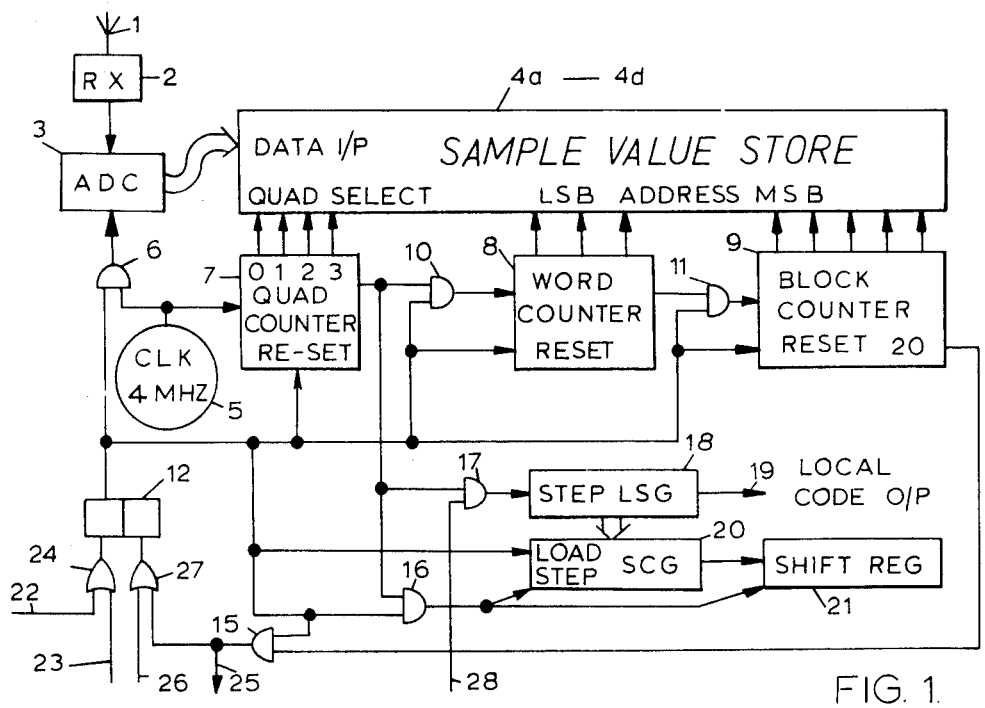
FIG. 1 is a schematic circuit diagram of a sampling stage of a code synchronizing apparatus constructed in accordance with the present invention.

FIG. 1 shows the apparatus involved in the first stage of the process. An aerial 1 is connected to a receiver 2 which detects signals carrying a pseudo-random binary code sequence and applies them to the analogue-signal input of an analogue-to-digital converter 3. The output lines of the converter 3 are connected to a sample value store (SVS) which actually comprises four parts called quadrants 4a–rd. A clock pulse generator circuit 5 is connected to a gate circuit 6 which controls sampling actions of the converter 3 and to a quad selection counter 7. The pulse generator circuit 5 provides pulses at four times the bit-rate of the incoming code signals, and outputs from the quad selection counter 7 are applied to energize input-enabling controls of the four quadrants 4a to 4d of the sample value stores sequentially. Hence the converter digitizes four sample values from each bit-period of the detected code-signal waveform, and each quadrant of the sample value store receives one sample value from every bit-period during this first (sampling) stage of the process.

The quad selection counter 7 is the first part of a chain of counter circuits also comprising a word counter 8 connected to the quad selection counter 7 by an and-gate 10 and a block counter 9 connected to the word counter 8 by an and gate 11. Parallel outputs from the counters 8 and 9 are connected to address inputs of the sample value stores 4a to 4d. The set output of a bistable circuit 12 is connected to resetting inputs of the counters 7, 8 and 9, to the gates 10 and 11 and to two other and-gates 15 and 16.

The carry output of the quad selection counter 7 is connected to the gate 16 and another gate 17. Outputs of the gates 16 and 17 are connected to the stepping inputs of two identical pseudo-random binary sequence generators 18 and 20 called LSG (Local Sequence Generator) and SCG (System Controlled Generator) respectively. The LSG 18 and SCG 20 are constructed to generate a code sequence identical to that which is expected to exist on the incoming signals, but they are initially unsynchronized with the incoming code sequence. The LSG is generally advanced by the signals from the counter 7 at the bit-rate of the code signals and it provides a local code output on a line 19. The SCG 20 has parallel input connections from the LSG 18, controlled by the set output of bistable circuit 12 so that it will be set to match the LSG 18 whenever the bistable circuit is switched to the set condition, and its output is fed to a shift register 21 having a shift control input connected to the output of gate 16.

The setting input of the bistable circuit 12 is connected to lines 22 and 23 through an or-gate 24. An output of the block counter 9, energized whenever the block counter reaches a count equal to N (N=20 in the specific embodiment), is connected to the and-gate 15. The output of and-gate 15 is connected to a line 25. This line 25 and another line 26 are connected through an or-gate 27 to a resetting input of the bistable circuit 12. The gate 17 is controlled by a line 28, which inhibits the gate 17 only during the last stage of a synchronizing process.

The synchronizing process is started by applying a signal to the line 22 which sets the bistable circuit 12. The setting of bistable 12 resets the counters 7, 8 and 9 to zero and causes the SCG to be set to match the LSG. It also enables the gate 6 to pass clock signals to the converter 3, enables the gates 10 and 11 to pass carry signals in the counter chain, and enables the gate 16 to pass signals from the counter 7 to the stepping and shifting inputs of the SCG 20 and shift register 21 respectively. The converter 3 starts sampling the incoming signals and the counters direct the sample values into consecutive locations in the four quadrants of the sample value store; simultaneously the LSG and SCG step through their sequences and a sequence of local code output signals is built up in the shift register 21.

Suppose that the incoming code bit-signals are represented by values of a function $R(kT)$ for $k=v, v+1, v+2, \ldots v+N$ where $v$ represents an arbitrary starting point and $T$ is the bit-period of the code signals. While the code signals may have been rectangular pulses originally, they will generally have been band-limited and distorted and overlaid by noise. Four samples are taken from each bit-period and processed in parallel using different quadrants of the sample value store; samples taken near the peak of each bit-signal will give the best correlation and the resulting output will be used in preference to outputs from the other quadrants.

Let the local code bit-signals produced by the LSG and SCG be represented by values of a binary function $S(kT)$ for $k=v+m, v+m+1 \ldots v+m+N$ where $mT$ is the time difference between the incoming code sequence and the local code sequence produced by the LSG 18; $m$ is unknown and has to be found and reduced to zero by stopping the LSG for a time dependent on $mT$; this is the purpose of the apparatus.

In each quadrant of the sample value store the sample values from consecutive bit-periods will be treated as N blocks of n words each, each word representing one sample value and each block representing a subsequence of sample values from n consecutive bit-periods. In the specific embodiment N=20 and n=8. The sample values $R(vT)$ taken in the first bit-period after the bistable 12 is set will be directed to the all-zeroes address in each quadrant of the SVS, and the sample values taken in subsequent bit-periods will be directed to successively increasing addresses. After Nn bit-periods the SVS quadrants will contain sample values $R(\overline{v+x}\,T)$ at address x for $x=0, 1, 2 \ldots Nn-1$, and then the shift register 21 will hold local code outputs $S(\overline{v+m+x}\,T)$ for $x=0, 1, 2 \ldots Nn-1$. Then the counter 9 enables gate 15 and thereby energizes line 25 which resets the bistable 12 bringing the first stage to an end; the SVS (4a–4d) and the shift register 21 now retain "snapshots" of sequences of incoming and local code taken in this sampling stage, but it should be noted that the LSG 18 continues generally in step with the incoming code but not synchronized with it—this is to say that though the LSG 18 forms the same sequence as the incoming code and is stepping on at substantially the same bit rate, it will be at a different place in the code sequence.

Figure 2:
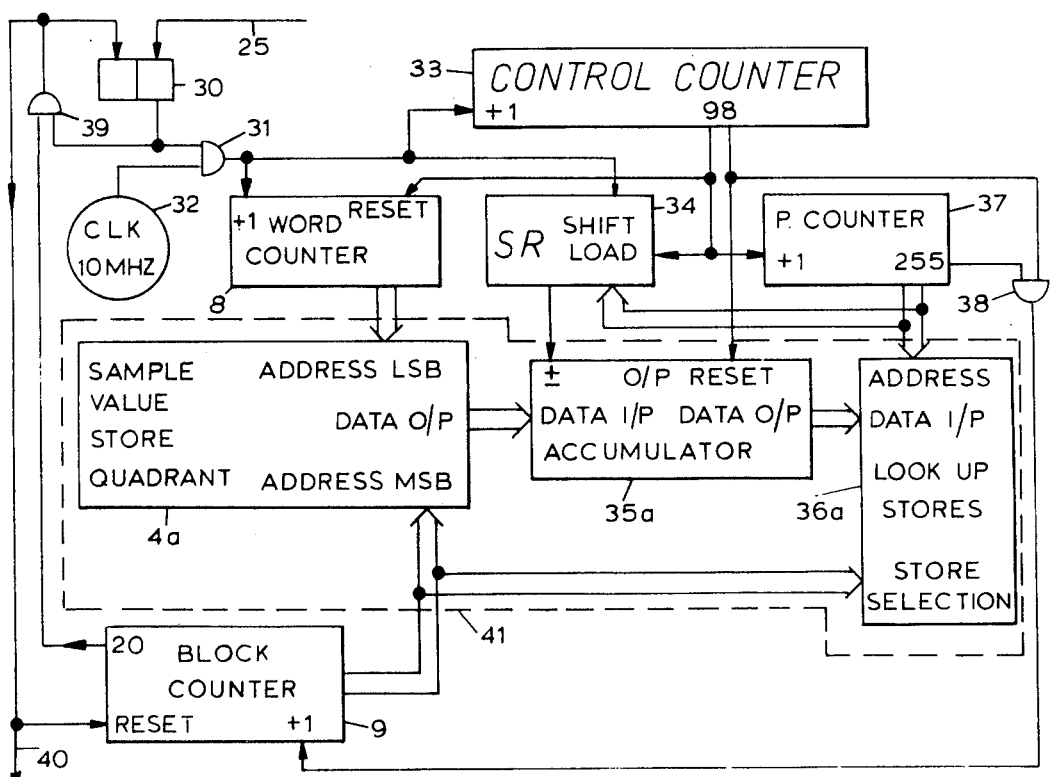
FIG. 2 is a schematic circuit diagram of a second stage of the apparatus which follows the stage shown in FIG. 1.

The line 25 from FIG. 1 is connected as shown in FIG. 2 to set a bistable circuit 30. An and-gate 31 is controlled by the set output of bistable circuit 30 and fast (10 MHz) clock pulses from a generator 32. The output of and-gate 31 is connected to incrementing inputs of the word counter 8 and a control counter 33, and to the shift input of a shift register 34. One quadrant 4a of the sample value store is shown with its address inputs connected to outputs of the word counter 8 and block counter 9. Data output lines of the quadrant 4a are connected to an accumulator circuit 35a, which has an add/subtract control line connected to the output of the shift register 34. Data output lines of the accumulator circuit 35a are connected to data inputs of a set of stores 36a called the lookup stores. In the specific embodiment N=20 and there are twenty stores in the set 36a, each capable of storing $2^n=256$ words of six bits each. Outputs from the block counter 9 control store selection circuits of the set 36a so that results associated with a particular block of sample-value signals will be directed to a correspondingly numbered one of the lookup stores 36a.

An output of the control counter 33, energized when it reaches a count of eight, is connected to an "output and reset" control line of the accumulator circuit 35a and to an and-gate 38. Another output energized when the counter 33 reaches a count of nine, is connected to a resetting input of the word counter 8, to a load control input of the shift register 34, and to an incrementing input of another counter 37 which will be called the p counter. The p counter 37 is arranged to count from 0 to $2^n - 1$ (which is 255 in the specific embodiment) and has an output energized when its count reaches 255 which is connected to the and-gate 38. The p counter 37 also has parallel output lines connected to the address inputs of the lookup stores 36a and to parallel input lines of the shift register 34. The output of the and-gate 38 is connected to an incrementing input of the block counter 9. An output of the block counter 9, energized when it reaches a count of N(=20 in this equipment) and the set output of bistable circuit 30 are connected to another and gate 39. The output of this and-gate 39 is connected to a line 40 and to resetting inputs of the bistable circuit 30 and the block counter 9.

The parts 4a, 35a and 36a shown within the broken line 41 in FIG. 2 are actually just one of four sets of parts, one for each quadrant of the sample value store, which are each provided with parallel connections to the rest of the apparatus like the connections shown.

The second stage is initiated by the signal on line 25. Its function is to take each block n=8 sample values from the sample value store and correlate it will all possible subsequences of n=8 binary code digits, storing the results in a corresponding one of the lookup stores. At the beginning of the second stage the counters 8, 9, 33 and 37 and the shift register 34 will contain all zeroes.

It will be convenient to represent the binary digits of the count in the p counter by symbols $p_r$ for r=0, 1, 2 . . . 7, $p_o$ being the least significant digit of the count. The action proceeds in minor cycles corresponding to cycles of the control counter 33, which is arranged to count from zero to nine and then restart from zero again. At the end of each minor cycle, +1 is added to the count in the p counter and the new value of the p counter is then loaded into the shift register 34 so that the digits of the p counter will be applied in sequence to the ± control input of the accumulator circuit 35a, with the least significant digit $p_o$ first. Clock pulses will advance the word counter 8, the control counter 33 and the signals in the shift register 34, simultaneously. In a typical case when the count in the block counter 9 has a value i the (r+1) th word of the (i+1) th block in the sample value store quadrant 4a will be presented to the accumulator circuit 35a simultaneously with the (r+1) th digit $p_r$ of the p count. Whenever the p digit signal applied to the ± control input is a 1, the accumulator circuit 35a adds the current sample value to a total held within it; when the p digit signal is a zero, it subtracts the current sample value from the cumulative total. At the end of each minor cycle when all the words of the (i+1) th block have been added or subtracted according to the digits $p_o$ to $p_7$ of the current p count value, the cumulative total will represent the summation $$\sum_{r=0}^{n-1} R(\overline{v + in + r} \; T) \cdot (2p_r - 1)$$

which will be directed into the (i+1) th lookup store at the address corresponding to the current p count. The accumulator 35a and word counter 8 will then be reset to zero and the p count incremented by +1. The next minor cycle will correlate the (i+1) th sample block with the next p count value. At the end of the minor cycle when the p count has reached its maximum value (all 1's) the block count is incremented by +1 and the p count is reset to all zeroes. Another set of correlations are performed with the next block of sample values and all possible p counts and these results are stored in the next one of the lookup stores. The incrementing of the block count is made subject to a slight delay to ensure that the last correlation total is safely stored before the store selection is changed. When all blocks have been considered, the block counter full output resets the bistable circuit 30 and applies a signal to line 40 to initiate the third stage.

Figure 3:
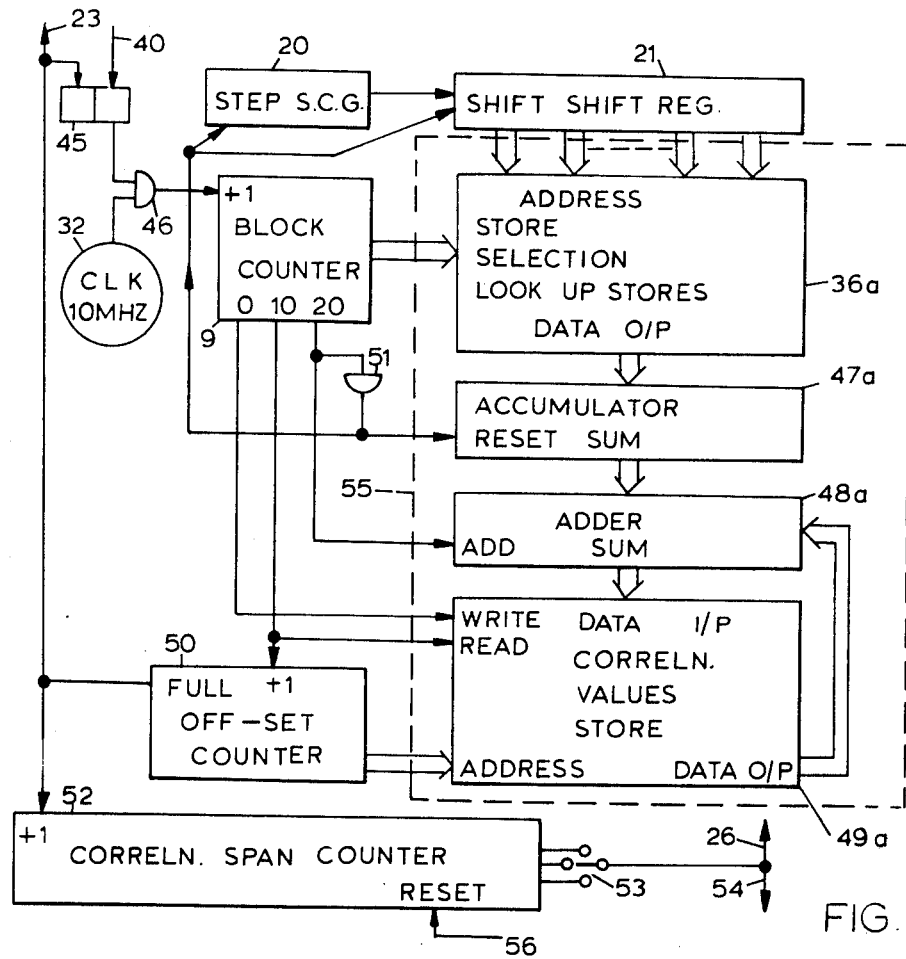
FIG. 3 is a schematic circuit diagram of a third stage of the apparatus which follows the stage shown in FIG. 2.

The parts involved in the third stage are shown in FIG. 3. The line 40 from FIG. 2 is applied to the setting input of a bistable circuit 45. The set output of this bistable circuit 45 and the output of the clock pulse generator 32 are connected to an and-gate 46 whose output is connected to the incrementing input of the block counter 9. Outputs of the block counter 9 control store-selection inputs of the lockup stores 36a as in FIG. 2. The address inputs of the lookup stores 36a are connected to outputs of the shift register 21, which has an input connected to receive signals from the system-controlled code generator 20. The data output lines of the lookup stores 36a are connected to an accumulator circuit 47a; this circuit 47a has an output connected to an adder circuit 48a. The sum output of the adder circuit 48a is connected to the data input lines of a store 49a which is called the correlation values store CVS and has data output lines connected to a second input of the adder circuit 48a.

The block counter 9 has an output energized at a count of zero, which is connected to a write control line of the CVS 49a; an output energized at a count of ten which is connected to a read control line of the CVS 49a and also to the incrementing input of a counter 50 which is called the offset counter; and an output energized at a count of 20 which is connected to an add control line of the adder circuit 48a and also to a delaying circuit 51. The output of the delaying circuit 51 is connected to a reset control of the accumulator circuit 47a, the stepping input of the SCG 20 and the shift input of the shift register 21. The offset counter 50 has a maximum capacity equal to the length L of the code to be synchronized, and has an overflow output line which is connected to the line 23 of FIG. 1, to a resetting input of the bistable circuit 45, and to the incrementing input of a counter 52 which is called the correlation span counter. A switch 53 is connected to allow any one of several alternative outputs of the correlation span counter 52 to be connected to a line 54 and to the line 26 of FIG. 1. In the complete equipment there are four sets of the parts within the broken line 55, connected in parallel and working on signals derived from different quadrants of the sample value store. A line 56 is connected to a resetting input of the correlation span counter 52.

From the description of FIG. 2 it should be recalled that the lookup stores 36a comprise a set of stores numbered from 0 to N−1 which is 19 in this particular equipment. The n=8 stages of the shift register 21 furthest from the SCG 20, which will initially hold the earliest block of local code samples S ($\overline{v+m+x}$ T) for x=0 to 7, are connected to the address inputs of the lookup store numbered 0; the next eight shift register stages are connected to the address inputs of lookup store numbered 1 and so on, the eight shift register stages nearest to the SCG 20 being connected to the address inputs of the store numbered 19 in the lookup stores 36a. It should also be remembered that the lookup store numbered 0 was filled in the second stage with the correlations of the first block of sample values with every possible set of n=8 bits.

When the bistable circuit 40 is set and the gate 46 enabled to pass clock pulses to the block counter 9, the counter 9 causes a scan of addresses in the lookup stores selected according to the segment of Nn bits of local code sequence held in the shift register 21. The contents of these addresses are correlations of blocks of sample values with corresponding blocks of local code sequence, and they are added together by the accumulator 47a. For instance in the first cycle of the block counter 9 the sums retrieved and added together will comprise $$\sum_{r=0}^{n-1} R(\overline{v+r}\ T) \cdot S(\overline{v+m+r}\ T)$$

$$\sum_{r=0}^{n-1} R(\overline{v+n+r}\ T) \cdot S(\overline{v+m+n+r}\ T)$$

$$\sum_{r=0}^{n-1} R(\overline{v+2n+r}\ T) \cdot S(\overline{v+m+2n+r}\ T)$$

———————————————

———————————————

$$\sum_{r=0}^{n-1} R(\overline{v+19n+r}\ T) \cdot S(\overline{v+m+19n+r}\ T)$$

and the total formed by the accumulator at the end of the cycle will be $$\sum_{r=0}^{Nn-1} R(\overline{v+r}\ T) \cdot S(\overline{v+m+r}\ T)$$

where N is used in place of 20 for the sake of generality. The modulus of the six most significant digits of this summation is presented to the adder circuit 48a and added to the contents of location 0 in the correlation values store 49a. (The offset counter starts with all zeroes). The accumulator total is reset to all zeroes, the offset counter incremented by plus one, and the signals in the SCG 20 and shift register 21 stepped one place on.

The next cycle of the block counter 9 similarly forms the correlation between the set of stored sample values and a sequence of local code signals one step advanced from the sequence formed in the first sampling stage, and this correlation is added to the amount in location 1 of the correlation values store. In fact successive cycles add a sum comprising $$\left| \sum_{r=0}^{Nn-1} R(\overline{v+r}\ T) \cdot S(\overline{v+m+b+r}\ T) \right|$$

to each location b in the CVS 49a for b=0 to b=L−1 (which is 16,383 in this equipment). When all the locations have been updated in this way, the overflow output of the offset counter 50 resets the bistable circuit 45, adds +1 to the count in the correlation span counter 52, and acting through line 23 initiates another first stage sampling action. This proceeds as described with reference to FIG. 1 causing a new set of sample values to be taken and stored in the sample value store quadrants 4a–4d, while simultaneously a sequence of local code signals is stored in the shift register 21 of FIG. 1. The correlation operations are then repeated as described with reference to FIGS. 2 and 3 to derive further summations from the new data and add them to the totals in appropriate locations of the CVS 49a. The whole process is done again and again for different sets of samples, until the correlation span counter 52 reaches a selected total and energizes the lines 26 and 54. The line 26 inhibits further sampling actions, while the line 54 initiates a search procedure, to find which location in the CVS 49a has developed the greatest total.

Figure 4:
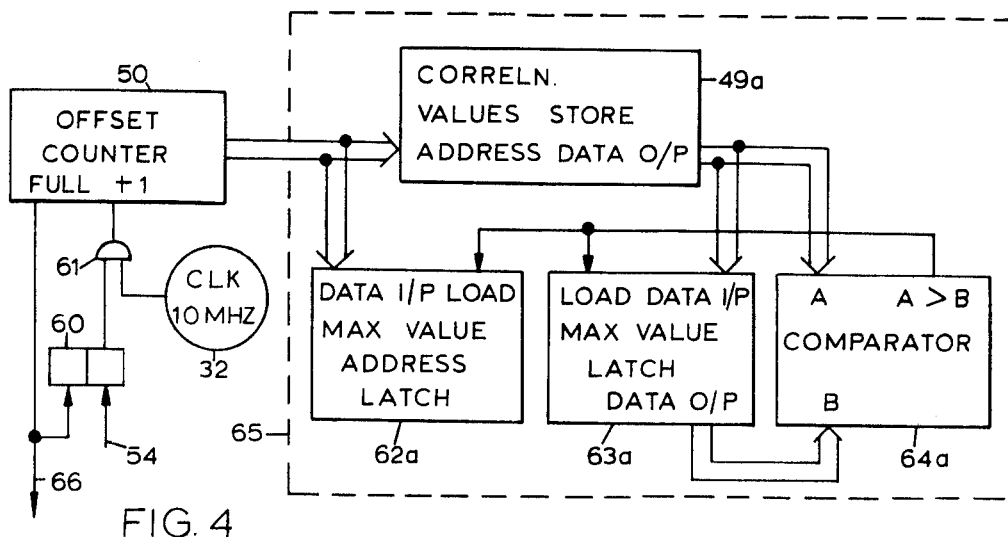
FIG. 4 is a schematic circuit diagram of a fourth stage of the apparatus which is concerned with memory store searching.

FIG. 4 shows parts involved in a first part of the search procedure. The line 54 is connected to a setting input of a bistable circuit 60. A set output of the bistable circuit 60 is connected to enable a gate circuit 61 to pass pulses from the 10 MHz clock pulse generator 32 to the incrementing input of the offset counter 50. The count value outputs of the offset counter 50 are connected to the address inputs of the CVS 49a and also to data input lines of a max value address latch circuit 62a. The data output lines of the CVS 49a are connected to data inputs of a max value latch circuit 63a and a comparator circuit 64a. Data outputs of the max value latch circuit 63a are connected to a second set of inputs of the comparator circuit 64a, and an output of the comparator circuit 64a is connected to load control lines of the latch circuits 62a and 63a. This arrangement comprising the parts within the broken line 65 is replicated for each quadrant. The overflow output of the offset counter 50 is connected to a line 66 and a resetting input of the bistable circuit 60.

When the bistable circuit 60 is set it causes the offset counter 50 to make a scan of the locations of the CVS 49a and corresponding stores for other quadrants (not shown). At the beginning of the scan the max value latch circuit 63a contains all zeroes. Whenever the accumulated correlation value from the scanned location of the CVS 49a exceeds the value stored in the max value latch circuit 63a, the comparator circuit 64a causes the contents of the latch circuits 63a and 62a to be replaced by the correlation value and current scan address respectively. Hence when the scan is completed the circuit 63a will contain the greatest correlation value and circuit 62a will contain the address at which it was stored. The line 66 then initiates the second part of the search procedure.

Figure 5:
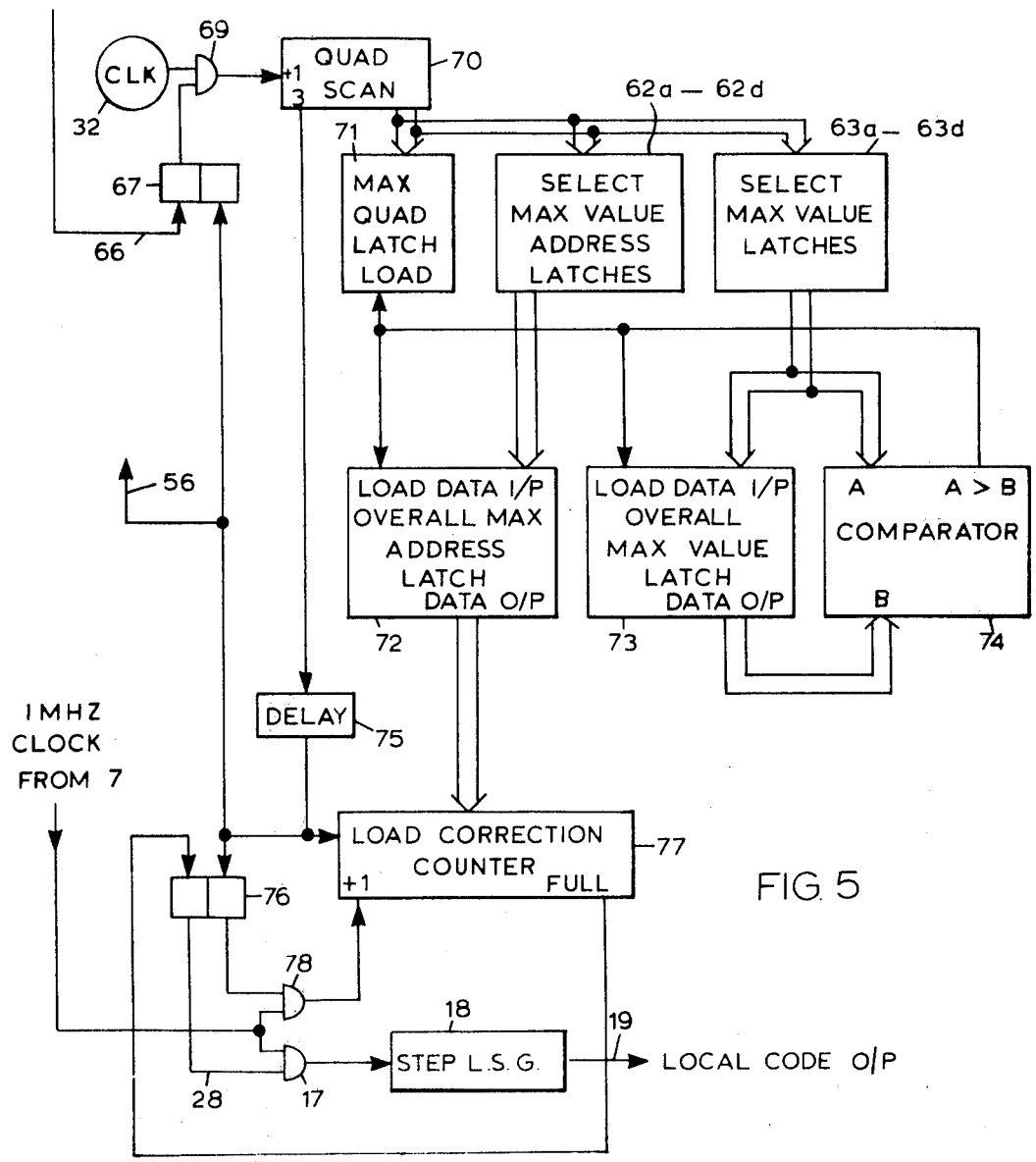
FIG. 5 is a schematic circuit diagram of a fifth stage of the apparatus which is concerned with a further part of memory store searching.

This involves the parts shown in FIG. 5. The line 66 energizes the setting input of a bistable circuit 67. A set output from this bistable circuit 67 enables a gate circuit 69 to pass clock pulses from the generator 32 to a quad scan counter circuit 70. Outputs from this quad scan counter 70 are connected to a max quad latch circuit 71 and to selection inputs of the max value address latches 62a-62d and the max value latches 63a-63d of the four quadrants. Outputs from the address latches 62a-62d are connected to an overall max address latch circuit 72, and outputs from the max value latches 63a-63d are connected to an overall max value latch circuit 73 and a comparator circuit 74. Data outputs of the overall max value latch 73 are connected to a second set of inputs of the comparator 74, and the comparator 74 controls loading actions of the latches 71, 72 and 73.

Clearly the quad counter 70 causes a scan of the max correlation values for the four quadrants, and the comparator 74 causes the greatest of these totals to be retained in the latch 73 and the address and quadrant in which it occurs to be entered into the latches 71 and 72. When this scan is complete an output from the counter 70 acting through a delay 75 causes the contents of the overall max address latch 72 to be loaded into a correction counter 77; this output is also applied though line 56 and other connections not shown to reset the correlation span counter (52 in FIG. 3), the bistable circuit 67 and the eleven latch circuits 62a-62d, 63a-63d, 71, 72, and 73. It also sets another bistable circuit 76.

This bistable circuit 76 has a set output controlling a gate 78 and a reset output which acts through the line 28 to control gate 17 (also shown on FIG. 1). The clock signal from counter 7 of FIG. 1, which is at the bit-rate of the incoming code signals is applied to both these gates 78 and 17. The output of gate 17 controls the stepping actions of the local sequence generator 18 to provide a local code output on line 19 as described with reference to FIG. 1. The output of gate 78 is connected to an incrementing input of the correction counter 77. An overflow output of the correction counter 77 is connected to a resetting input of the bistable circuit 76.

When the search procedure has found the address of the maximum correlation total and it has been loaded into the correction counter 77, suppose that its value is x. This means that the maximum correlation between the local code and the received code has been derived from calculations in which a "snapshot" of a sequence of received signals was correlated with a local code sequence x steps subsequent to the state of the local code at the time of the "snapshot". It indicates that the local code output can be brought into synchronism with the incoming code by making the local code generator catch up x steps relative to the incoming code. The same effect can be obtained more conveniently in practice by freezing the state of the local sequence generator 18 for L-x bit-periods of the code bit-rate where L is the length of the code cycle. This is achieved by the bistable 76, gates 78 and 17 which simply redirect the code-bit-rate signals into the correction counter 77 until it reaches a total L and overflows; then the bit-rate signals are returned to the LSG 18 so that it should proceed in synchronism with the incoming code.

Clearly many details of the circuits described may be arranged in alternative ways. Additional gates, delays and other connections may need to be included to ensure that the whole system operates correctly and in sequence as described, and to ensure that connections made for any stage of the process do not have unwanted effects in other stages. Additional circuits may be provided to make minor corrections to the timing of decoder circuits using the local code signals according to which of the quadrants is providing the greatest correlation. The number of correlations totalled before starting the search procedure may be chosen by setting the switch 53 according to circumstances. The parameters n, N and L, the number of digits used to represent each sample value, and the number of digits retained in the third stage of the process may be given other values in other applications of the invention.

I claim:

1. Code synchronizing apparatus including a local code signal generator, means for obtaining a sequence of samples of an incoming signal and a sequence of local code signals, correlator means for correlating said sequence of samples with sequences of local code signals offset by different integral numbers of bit-periods from a sequence of local code signals produced by said local code signal generator while the incoming signals were being sampled, means for adding together the correlations obtained by said correlator means, means for identifying the offset which produces the maximum summation of correlations, and means for correcting the local code generator timing by an amount dependent on the magnitude of the offset so identified.

2. Code synchronizing apparatus as in claim 1 wherein said correlation means comprises means for correlating each of a plurality of consecutive subsequences of n signal samples with all possible subsequences of n binary digits and for storing the correlations thereby obtained, means for deriving the correlation between a local binary code sequence and a signal sample sequence by retrieving the correlation results from store using addresses determined by subsequences of the local code sequence, and adding the correlation results together to form a subtotal, and adding said subtotal to said correlation results thereby forming a post detect integrator, and means for repeating said reference and summing together for each offset sequence.

3. Code synchronizing apparatus as in claim 2 wherein the sequence of local code signals is a pseudo-random binary sequence and the value of n is the nearest integral value to a solution of the equation $$L = 2^n[1 + 0.7n(n-1)]$$

where L is the length of a complete cycle of the pseudo-random binary sequence to be used.

* * * * *